US006335665B1

(12) United States Patent
Mendelsohn

(10) Patent No.: US 6,335,665 B1
(45) Date of Patent: Jan. 1, 2002

(54) ADJUSTABLE PHASE AND DELAY SHIFT ELEMENT

(75) Inventor: Joseph Patrick Mendelsohn, Englishtown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/406,919

(22) Filed: Sep. 28, 1999

(51) Int. Cl.[7] .............................. H01P 5/12; H01P 5/22; H01P 1/18; H03H 7/20

(52) U.S. Cl. ....................... 333/139; 333/109; 333/117; 333/156

(58) Field of Search ................................ 333/139, 161, 333/164, 156, 109, 117

(56) References Cited

U.S. PATENT DOCUMENTS 3,628,162 A 12/1971 Lunden et al. .............. 327/248
4,395,688 A 7/1983 Sellers ....................... 333/169
5,119,050 A * 6/1992 Upshur et al. .............. 333/164
6,060,962 A * 5/2000 Sokolov et al. ............. 333/161

* cited by examiner

*Primary Examiner*—Robert Pascal
*Assistant Examiner*—Kimberly E Glenn
(74) *Attorney, Agent, or Firm*—Morgan & Finnegan, LLP

(57) ABSTRACT

An apparatus and method provide an adjustable phase and time delay to an input signal. The apparatus includes an inverting element and first and second variable capacitors. The inverting element has a first end serially coupled with the input signal and a second end. The first variable capacitor is coupled between the first end of the inverting element and first voltage. The second variable capacitor is coupled between the second end of the inverting element and a second voltage. The first and second variable capacitors are separately adjustable to controllably vary a phase shift and a delay of a reflection of the input signal. The first and second voltages may be at the same or different potentials.

The input signal may be coupled to the inverting element through a directional coupler, such as a circulator. The input signal, which is reflected by the inverting element, may be coupled back through the directional coupled and output as the output signal having a desired phase shift and delay relative to the input signal.

8 Claims, 10 Drawing Sheets

ADJUSTABLE PHASE AND DELAY SHIFT ELEMENT

FIELD OF THE INVENTION

The present invention relates to electronic and electromagnetic circuits, and more particularly, to an apparatus for introducing an adjustable delay and phase shift onto an input signal.

BACKGROUND OF THE INVENTION

In many electronic systems, it is necessary to adjust a phase and delay associated with a signal. Conventionally, the addition of delay to a signal is done using delay lines. For example, a series of delay lines is conventionally provided where each delay line has a fixed amount of delay. The delay lines may be connected together to provide discreet increases in delay.

Delay lines may be undesirable in applications that require a precise amount of delay because delay lines only add delay in discrete increments. Moreover, conventionally adjusting both delay and phase requires both delay lines and additional components for varying the phase. The additional components may need to be selected individually, for each manufactured circuit or system, depending on the particular manufacturing idiosyncrasies of the delay lines and the circuit or system itself.

In view of the shortcomings of conventional techniques, there is a need for an electrically adjustable circuit to precisely control delay and phase shift imparted to an input signal over a continuous, rather than a discrete, range of values. The need is particularly acute when the input signal is in the microwave range and precise delays in picosecond range are required.

SUMMARY OF THE INVENTION

According to the present invention, an apparatus provides an adjustable phase and time delay to an input signal. The apparatus includes an inverting element and first and second variable capacitors. The inverting element has a first end serially coupled with the input signal and a second end. The first variable capacitor is coupled between the first end of the inverting element and a first voltage. The second variable capacitor is coupled between the second end of the inverting element and a second voltage. The first and second variable capacitors are separately adjustable to controllably vary a phase shift and a delay of a reflection of the input signal. The reflection of the input signal is conveyed as the output signal. The first and second voltages may be at the same or a different potential, such as a ground potential or a ground or power potential of a power supply.

In one embodiment of the invention, the inverting element is a quarter wavelength transmission line. Either or both of the variable capacitors may be voltage variable, such as varactors, or they may be variable though manual adjustment. When the variable capacitors are voltage variable, a first adjustable voltage may be applied across the first variable capacitor and a second adjustable voltage may be applied across the second variable capacitor. The first and second adjustable voltages are separately adjustable, thus permitting separate adjustment of the capacitance values of the fist and second variable capacitors to controllably vary the phase and the delay of the reflected input signal.

The input signal may be coupled to the inverting element through a directional coupler, such as a circulator. The circulator has first, second and third ports and preferentially routes signals incident at one port to another port. For example, signals applied at the first port are routed to the second port and signals applied at the second port are routed to the third port. According to one embodiment of the present invention, the input signal is applied to the first port of the directional coupler and conveyed to the second port which is coupled with the first end of the inverting element. The input signal is reflected by the inverting element and variable capacitors back into the second port. The reflected signal is then output from the third port as an output signal having a desired phase shift and delay relative to the input signal.

A system for correcting the phase and delay of a linear amplifier according to the present invention includes a linear amplifier, a phase and delay shifting element, a coupler and an error circuit. The phase and delay shifting element is adjustable to impose a variable delay and phase shift to signals applied to its input. The coupler receives and divides an input signal into first and second signals and conveys the first signal to an input of the linear amplifier and the second signal to an input of the phase and delay shifting element. The error circuit is coupled to the outputs of the linear amplifier and the phase and delay shifting element and produces an error signal based on differences between the outputs.

BRIEF DESCRIPTION OF THE FIGURES

The above identified objects, features and advantages will be more fully appreciated with reference to the detailed description and the appended drawing figures, in which.

DETAILED DESCRIPTION

Figure 1:
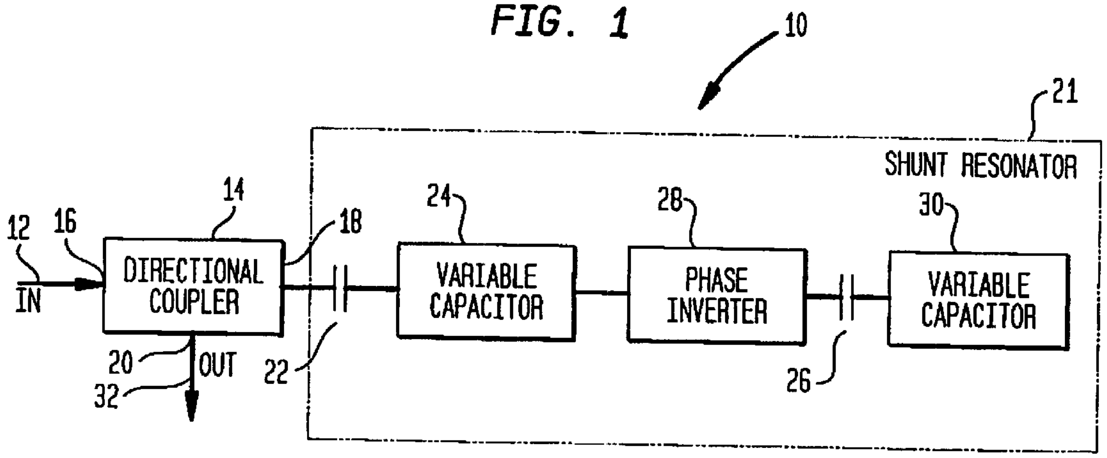
FIG. 1 depicts an embodiment of the delay and phase shifting element according to the present invention which includes variable capacitors and a phase inverting element.

FIG. 1 depicts an embodiment of a delay and phase shifting element according to the present invention for adjustably shifting the phase and delay of a signal applied at an input. Referring to FIG. 1, the delay and phase shifting element 10 includes a directional coupler 14 and a shunt resonator circuit 21. The directional coupler has three ports 16, 18 and 20.

The directional coupler preferentially routes signals incident at one port to another port. For example, the directional coupler 14 conveys signals incident at port 16 to port 18 for output. Similarly, the directional coupler 14 conveys signals incident at port 18 to port 20 for output. Devices for implementing the directional coupler 14 are well known and illustratively include hybrid circuits and directional couplers, such as microstrips, waveguides, circulators and isolators. Any of these components may be ferrite components, which are non-reciprocal in that the insertion loss for a wave travelling between two ports is not the same in one direction as it is in the other. Probably the most commonly used ferrite, directional coupler is a circulator. A circulator is a piece of ferrite which, when magnetized, becomes nonreciprocal, preferring progression of electromagnetic fields in one circular direction. An ideal circulator has the scattering matrix:

$$[S] = \begin{matrix} 0 & 0 & S_{13} \\ S_{21} & 0 & 0 \\ 0 & S_{32} & 0 \end{matrix}$$

An isolator is a circulator with one of the ports terminated in a matched load. It is used in a transmission line to pass power in one direction but not in the reverse direction. A four port version is typically called a duplexer. Any of these components is suitable for implementation as the directional coupler 14.

An input signal 12 is applied to the directional coupler 14 at port 16. The input signal is a signal to which one desires to add a phase shift and delay. The input signal 12 propagates through the directional coupler to port 18, where it is output to the shunt resonator circuit 21. The shunt resonator circuit 21 adjustably imparts a phase shift and delay to the input signal, which is reflected back through port 18 of the directional coupler 14 to port 20. The reflected signal is output from the directional coupler 14 at port 20 and is the output signal 32. As will be described below, the shunt resonator circuit 21 includes adjustable circuit elements enabling the phase shift and delay imparted to the input signal to be precisely varied and controlled. Adjustments are made to the adjustable circuit elements in order to impart a desired phase shift and delay to the output signal 32 using the input signal 12 as a reference.

In one embodiment of the invention, the shunt resonator circuit 21 includes dc blocking capacitors 22 and 26, variable capacitors 24 and 30, and a phase inverting element 28. The dc blocking capacitor 22 is coupled between port 18 of the directional coupler 14 and the variable capacitor 24. The capacitor 22 typically has a low impedance value and therefore appears as a short circuit to frequencies of interest, but an open circuit to dc current. The capacitor 22 (and 26) is optional and may be implemented only if necessary to block dc currents. The variable capacitor 24 is coupled from the capacitor 22 to a voltage either directly, or through a network of capacitive, resistive or inductive components. The voltage may be a ground or other potential from a power supply or any other convenient voltage source or sink. The dc blocking capacitor 26, which passes frequencies of interest and blocks dc currents, is coupled between the variable capacitor 30 and the phase inverting element 28.

Figure 8:
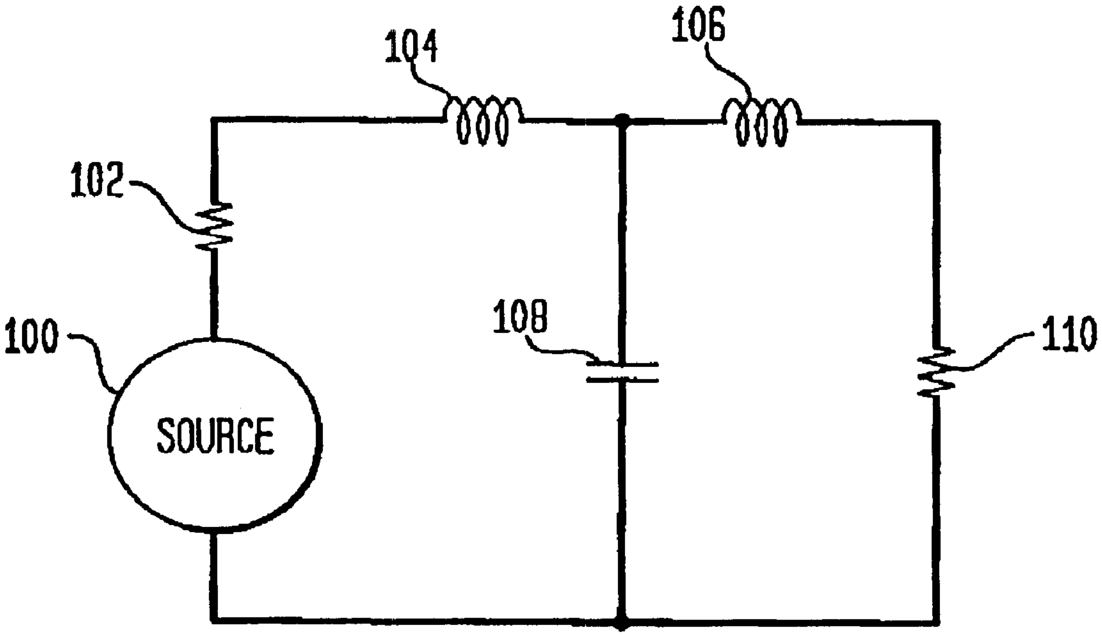
FIG. 8 depicts a lumped element inverter.

The phase inverting element 28 is coupled between the variable capacitor 24 and the dc blocking capacitor 26. It inverts the phase of the input signal approximately 90 degrees. The phase inverting element may be implemented as a quarter wavelength transmission line or using lump circuit elements in a well known manner. For example, FIG. 8 illustrates a lump element example of a phase inverter. Assume, for example that the inductors 104 and 106 each have a 225 nH value, that the capacitor 108 has a 45 pf value and that the resistor 110 has a 100 Ohm value. Further assume that the source 100 operates at a center frequency of 50 MHz and has a source impedance 102 of 50 Ohms. The impedance of elements 104–110 seen from the output of resistor 102 is 50 Ohms. The impedance of the inductors 104 and 106 are j70.7 Ohms and the capacitor 108 is −j70.7 Ohms. Therefore, the phase through the LC network is −90° and it acts like a transmission line of characteristic impedance 70.7 Ohms.

For high frequencies, such as frequencies in the microwave range, the wavelengths of the input signal are small enough that quarter wavelength transmission line implementations are more convenient than lump circuit element implementations. The phase inverter 28 is terminated (through the dc blocking capacitor 26) with the variable capacitor 30. The variable capacitor 30 may be connected directly to a voltage or indirectly to the voltage through a network of capacitive, inductive and resistive components. The voltage may be a ground potential or other potential from a power supply or any other convenient voltage source or sink.

The delay and phase shifting element may be implemented using discrete components or may be manufactured as a single integrated circuit or as a combination of an integrated circuit and discrete components. Hybrid microwave integrated circuits, for example, include transmission lines and conductors on the integrated circuit and discrete components bonded to the substrate. Monolithic microwave integrated circuits include all circuit elements on the integrated circuit.

During use of the circuit depicted in FIG. 1, an input signal 12 is applied to the port 16 of the directional coupler. The directional coupler then conveys the input signal to port 18. The input signal then emanates from port 18 and is reflected by the variable capacitors 24 and 30 and the phase inverting element 28 back into port 18 of the directional coupler 14. The amount of phase shift and delay imparted to the reflected signal is determined based on the values of each of the variable capacitors 24 and 30. In one embodiment of the invention, the variable capacitors 24 and 30 are voltage variable and the shunt resonator has a reflection characteristic that changes linearly with voltage applied to the variable capacitors 24 and 30 when the voltage applied to the capacitors 24 and 30 is the same. As the capacitance values 24 and 30 are changed, the angle of the reflected signal is changed. This produces the desired phase shift. This also produces a specific delay for each voltage setting and its corresponding phase shift. Both phase and delay change when both or either voltage setting is adjusted. By using a separate voltage on each variable capacitor, the phase and delay may be precisely selected. The Phase shifts of −180° to +180° may be achieved at desired delays. For example, delays in the range of 10 picoseconds to 5 nanoseconds may be imparted for phase shifts in the range of −180° to +180° for frequencies in the 0.5 to 5 GHz range. It will be understood, however, that the principles of the present invention are not limited to any particular frequency range and indeed may be implemented at frequencies less than 500 MHz as well as at frequencies in excess of 5 GHz. The range of delay afforded by the shunt resonator circuit depends upon the frequencies of the input signal.

Figure 2A:
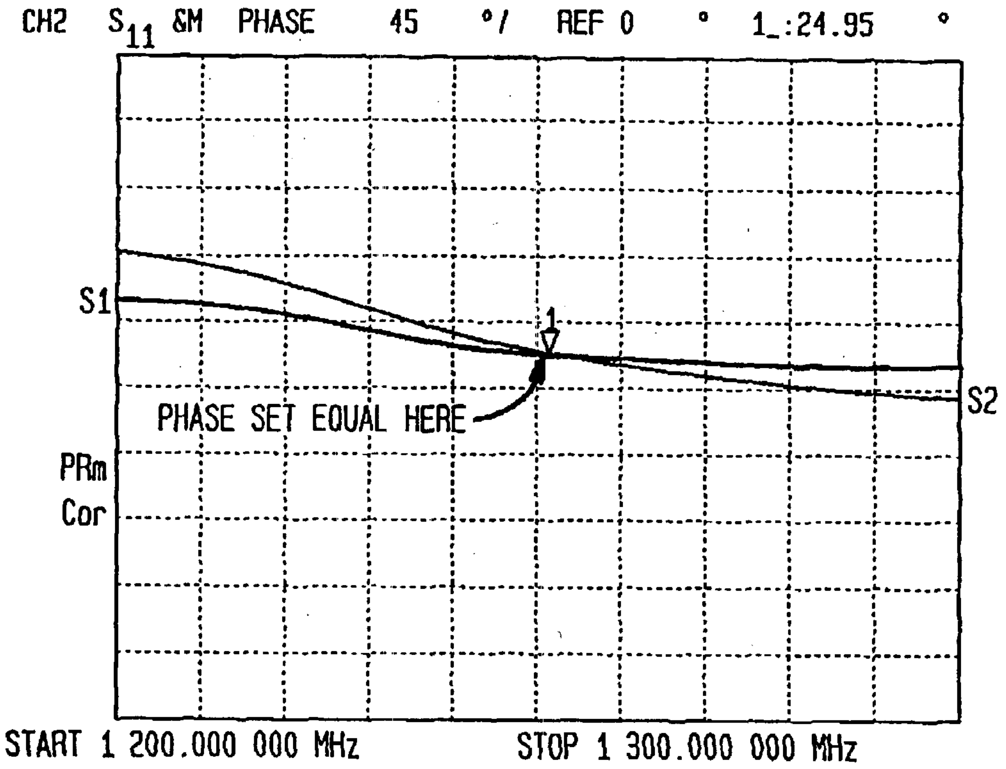
FIGS. 2A and 2B illustratively depict graphs of phase shift vs. frequency and delay vs. frequency for an input signal and an output signal according to the present invention.
Figure 2B:
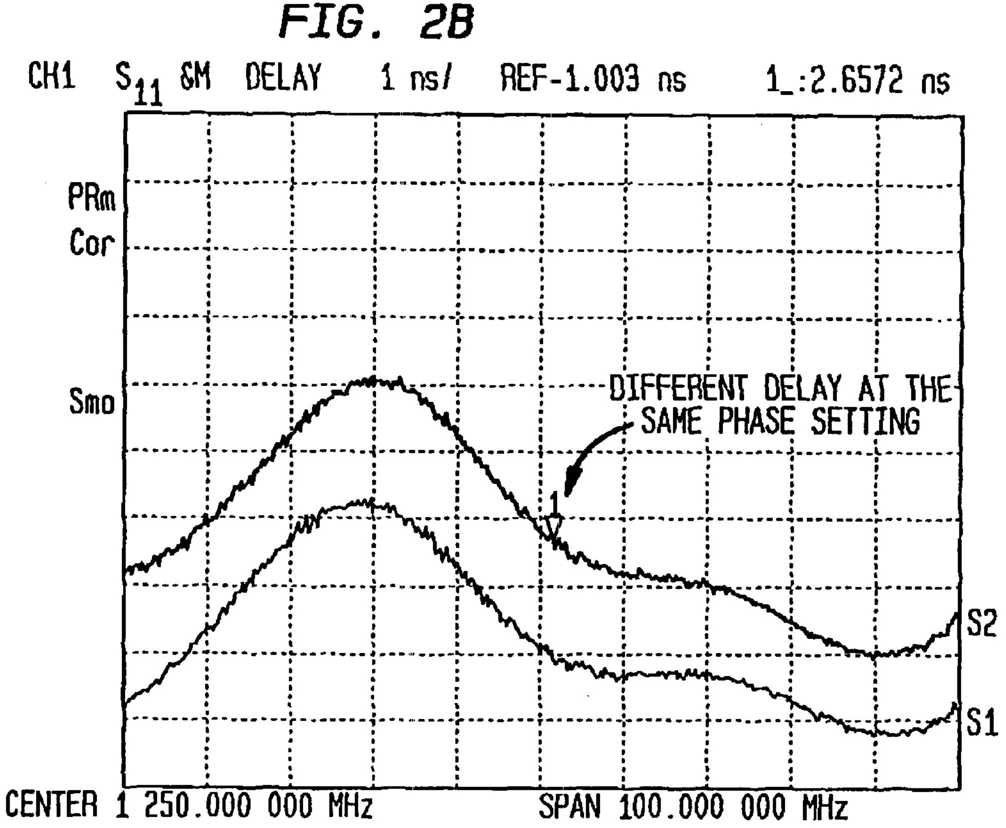

FIGS. 2A and 2B respectively depict a graph of phase shift vs. frequency and a graph of delay vs. frequency. In both graphs, line represents an output signal with one setting of the capacitors and line S2 represents the output signal with different settings of the capacitors, according to the present invention. Referring to FIG. 2A, at approximately 1.25 GHz, the phase of the output signal S1 is set equal to the phase of the output signal S2. Referring to FIG. 2B, the output signal S1 is delayed by approximately 2 nanoseconds relative to the output signal S2.

Figure 3:
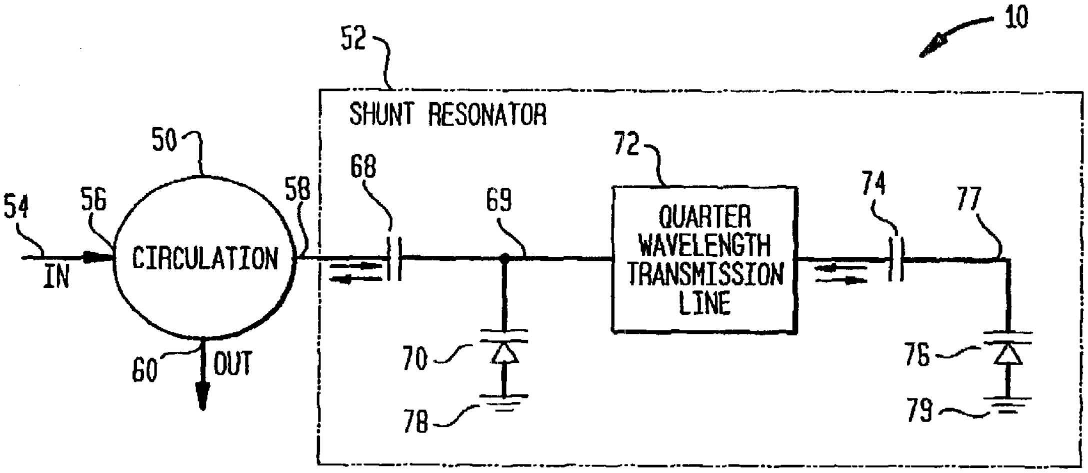
FIG. 3 depicts an embodiment of the delay and phase shifting element according to the present invention which includes varactors and a circulator as the directional coupler.

FIG. 3 depicts another embodiment of the delay and phase shifting element 10 according to the present invention. Referring to FIG. 3, a hybrid circulator 50, which includes three ports 56, 58 and 60, is coupled to a shunt resonator circuit 52. An input signal 54 is applied at port 56 of the circulator 50. The input signal is conveyed to and output from port 58 to the shunt resonator circuit 52. The shunt resonator circuit 52 includes a de blocking capacitor 68 coupled to the port 58 and node 69. A varactor 70, which produces a voltage variable capacitance, is coupled between node 69 and a ground potential 78. The varactor is a diode that provides a variable capacitance cross itself in response to voltage applied to it. An adjustable voltage source or supply V1 is applied to node 69 and therefore across the varactor 70. For example, the voltage source V1 may have a positive (or negative) terminal coupled to the node 69 and its other terminal coupled to the ground terminal 78. The voltage source may be adjusted to vary the capacitance of the varactor. The voltage source may be implemented in any convenient manner, including using the output of a digital to analog converter, a voltage regulator, voltage supply or any other suitable technique. The capacitor 68 prevents current from the dc voltage applied at node 69 from entering port 58 of the circulator 50.

A quarter wavelength transmission line 72 is coupled between another de blocking capacitor 74 and the node 69. The quarter wavelength transmission line acts as an open circuit and thus produces a phase inversion on incident signals. It will be understood, however, that the transmission line need not be exactly a quarter of a wavelength to function properly. Rather, any length between approximately ⅕ and ⅓ of a wavelength as well as odd multiples of a quarter wavelength would work well. The capacitor 74 is coupled between the quarter wavelength transmission line 72 and the node. A second varactor 76 is coupled between node 77 and ground. The capacitor 74 prevents de current from the voltage source V1, applied at node 69 from reaching node 77. The voltage source V2 is applied at node 77 to bias the varactor 76. For example, the voltage source V2 may have a positive (or negative) terminal coupled to the node 77 and its other terminal coupled to the ground terminal 79. The voltage source may be adjusted to vary the capacitance of the varactor. The voltage source may be implemented in any convenient manner, including using the output of a digital to analog converter, a voltage regulator, voltage supply or any other suitable technique. The capacitor 74, coupled between node 77 and the quarter wavelength transmission line 72, prevents dc current from flowing into the quarter wavelength transmission line 72.

During operation, different voltages may be applied at V1 and V2 in order to change the phase shift and delay of signal reflected by the shunt resonator back into port 58 of the circulator 50 and output from port 60. Each voltage V1 and V2 applied at a corresponding varactor allows the capacitance to be changed to a desired value. FIGS. 4A–4F illustrate examples of ranges of delay and phase shifts generated for the circuit depicted in FIG. 2 where the following conditions are assumed: The input 54 is coupled over a 50 Ohm transmission line to port 56 of the circulator 50. Varactor 70 is denoted C1 and varactor 76 is denoted C2. C1 is held constant and C2 is varied. The value of C1 is noted as a heading and the range of C2 is noted for each line present in the graphs illustrated in FIGS. 4A–4F. The quarter wavelength transmission line 72 is selected for a center frequency of 1 GHz and also has an impedance of 50 Ohms. The output port 60 of the circulator 50 is terminated with a 50 Ohm load. Each line on the graphs illustrated in FIGS. 4A–4F represents the difference between the signal input at port 56 of the circulator and output from port 60 of the circulator.

Figure 4A:
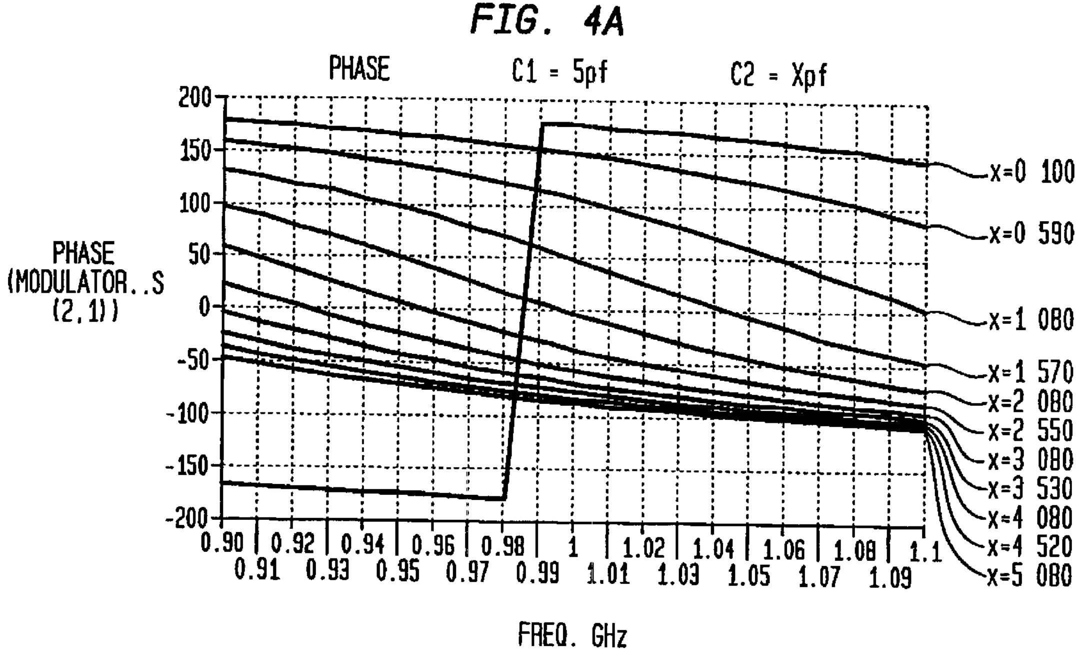
FIGS. 4A–4F illustrate graphs of delay and phase shift for the circuit depicted in FIG. 2 under conditions where one capacitor of the shunt resonator is held constant and the other is varied.
Figure 4B:
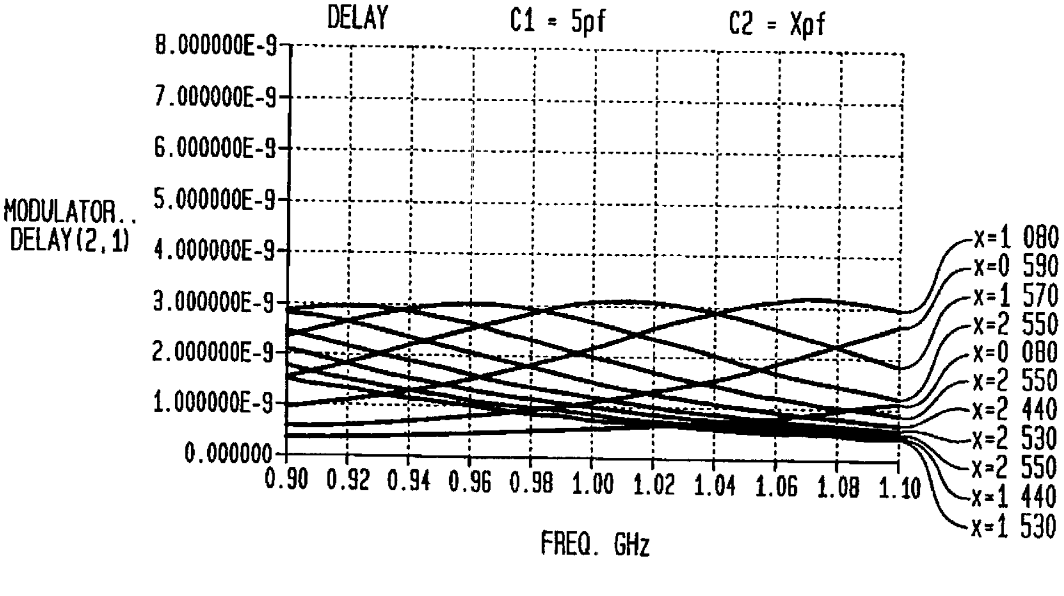
Figure 4C:
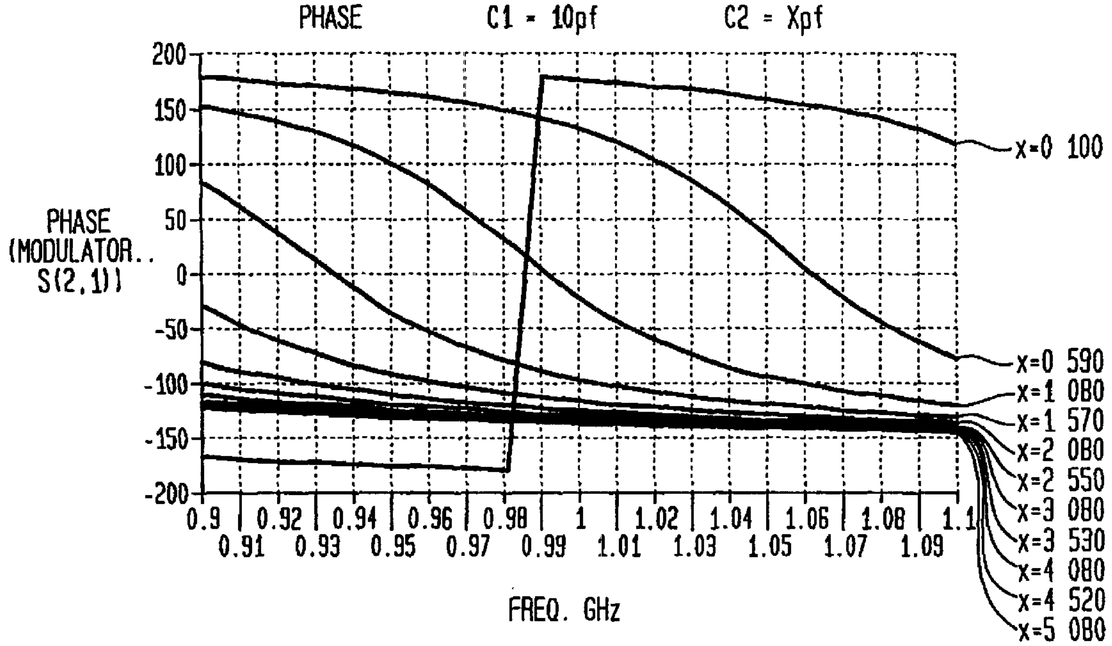
Figure 4D:
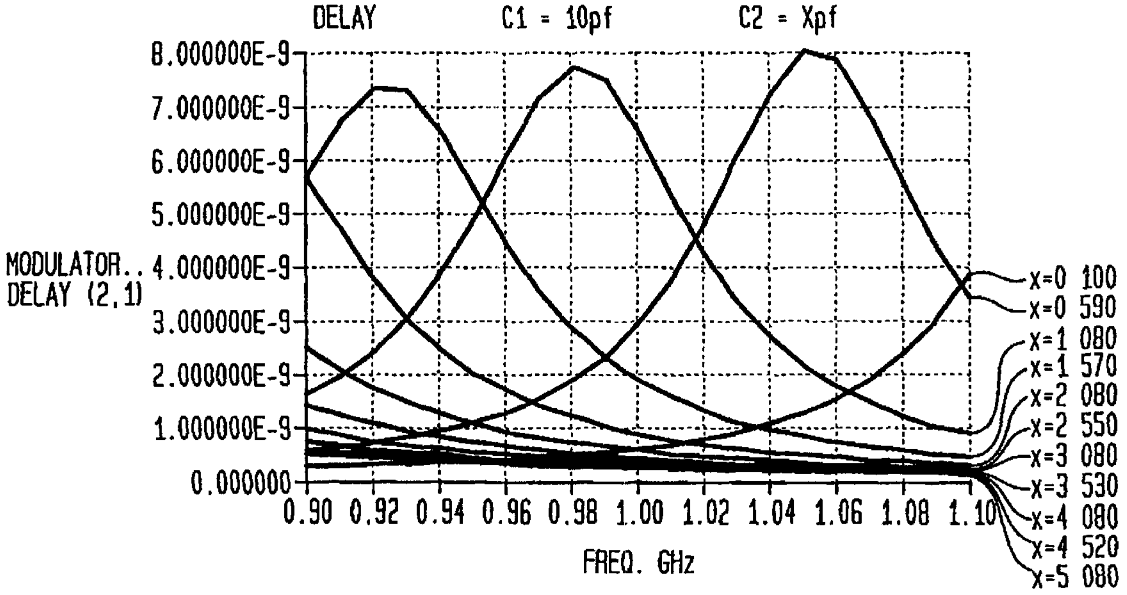
Figure 4E:
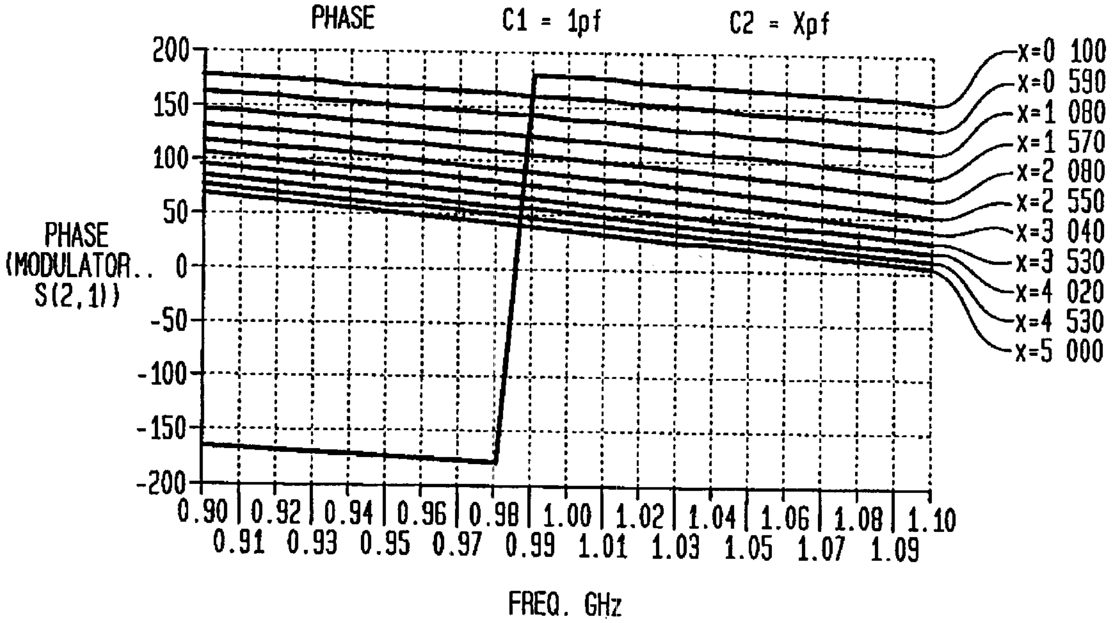
Figure 4F:
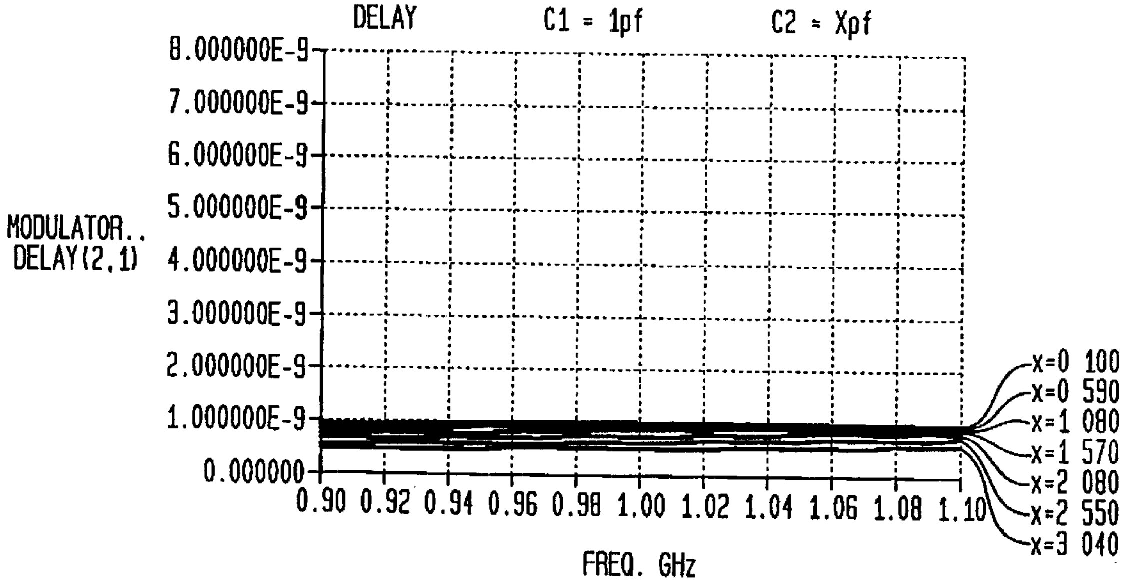

Referring to FIGS. 4A and 4B, it is apparent that C1 is held constant at 5 pf while C2 is varied over a range of 0.1 pf–5 pf. Phase shifts from −165°–180° and delay of between 0.5 nanoseconds–3.2 nanoseconds may be achieved. Referring to FIGS. 4C and 4D, it is apparent that C1 is held constant at 10 pf while C2 is varied over a range of 0.1 pf–10 pf. Phase shifts from −180°–180° and delay of between 0.2 nanoseconds–8.0 nanoseconds may be achieved. Referring to FIGS. 4E and 4F, it is apparent that C1 is held constant at 1 pf while C2 is varied over a range of 0.1 pf–5 pf. Phase shifts from −180°–180° and delay of between 0.5 nanoseconds–1.0 nanoseconds may be achieved. By selecting values for C1 and C2, nearly any combination of delay and phase shift can be achieved within a desired range.

Figure 5:
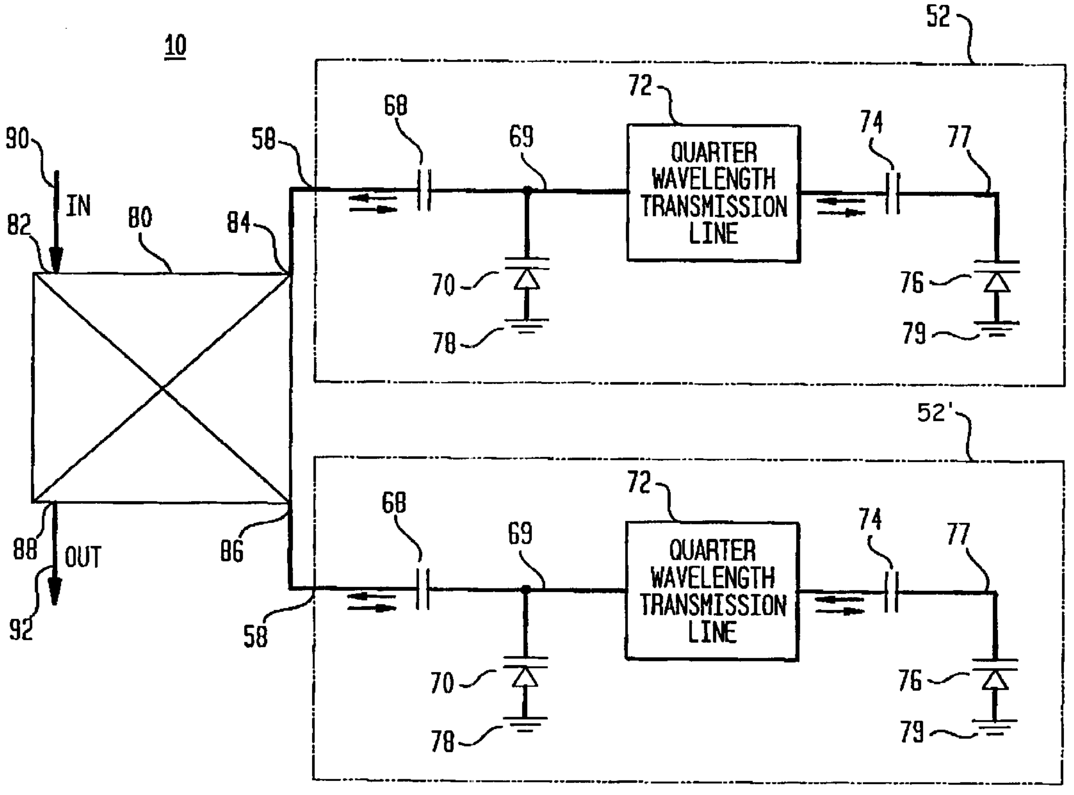
FIG. 5 depicts an embodiment of the phase and delay shifting element according to the present invention which includes two resonant circuits coupled to a circulator element.

FIG. 5 depicts still another embodiment of the phase and delay shifting element according to the present invention. In this embodiment, a hybrid circulator 80 includes four ports 82–88. An input signal 90 is applied to the port 82 of the circulator 80. The circulator 80 conveys half of the input signal to port 84 where it is output to the first shunt resonator circuit 52. The incident signal is then reflected by the first shunt resonator circuit 52 back into port 84 of the circulator 80 which is then conveyed to port 88. The circulator 80 also conveys half of the input signal to port 86, where it is output to the second shunt resonator circuit 52'. The second shunt resonator circuit 52' reflects the incident signal back into port 86 of the circulator which conveys the reflected signal to port 88. Port 88 in turn outputs the combined output signal 92. The phase shift and delay of the output signal 92 relative to the input signal 82 are determined by the values of the individual voltages applied at V1 and V2 of each of the shunt resonator circuits 52 and 52'.

Figure 6:
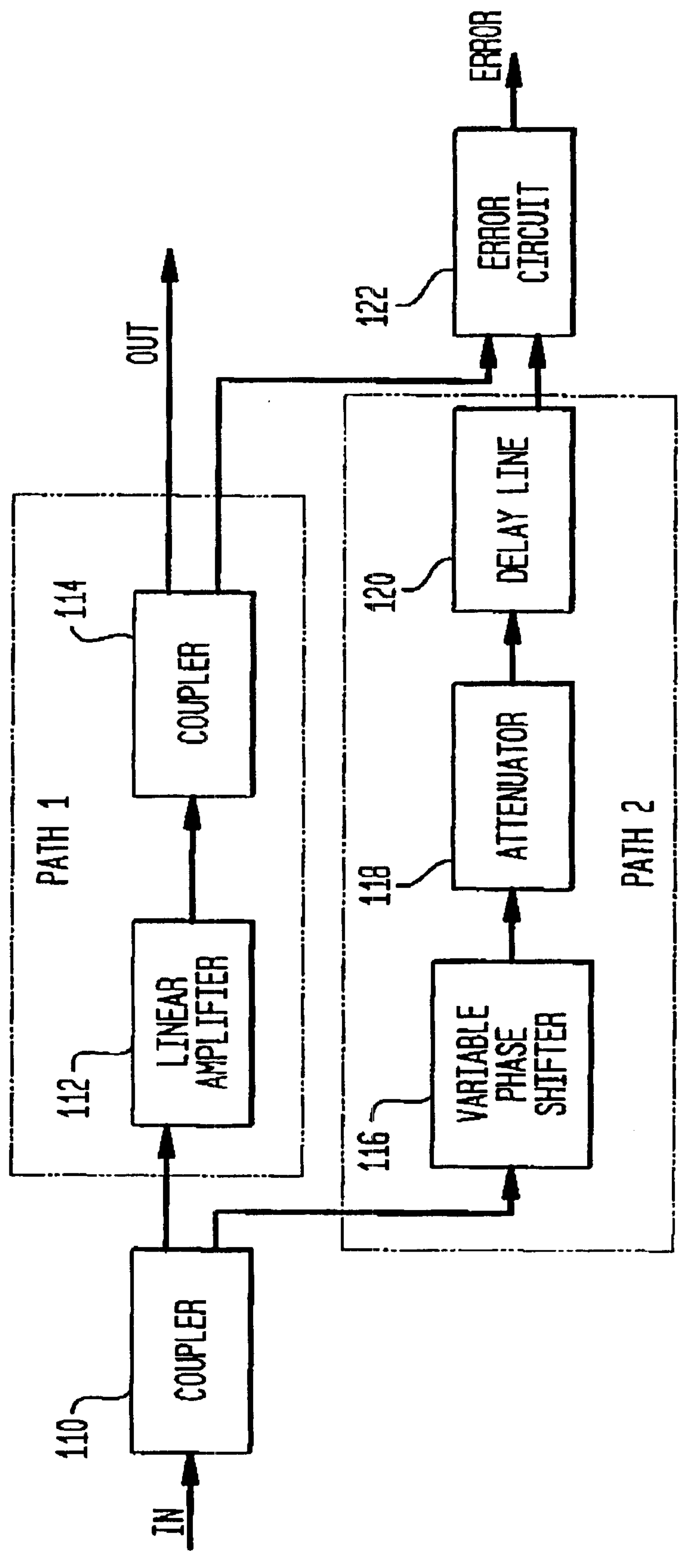
FIG. 6 depicts a system, including a linear amplifier, for correcting errors in the linear amplifier.

FIG. 6 depicts a system, including a linear amplifier for correcting phase and delay of the linear amplifier. Referring to FIG. 6, an input signal arrives at a coupler 110 which divides the input signal into two output signals, each of which is conveyed along a separate path 1 or 2. Path 1 includes a linear amplifier 112 which amplifies the incident signal and conveys it to the coupler 114. Linear amplifiers are well known. The coupler 114 divides the output of the linear amplifier into two signals. One signal is conveyed as an output of the linear amplifier 112 and the other is conveyed to the input of an error element 122.

Path 2 receives the divided input signal at the variable phase shifter 116. The variable phase shifter 116 shifts the phase of the input signal a desired amount to correct phase error in the linear amplifier and conveys the shifted signal to an attenuator 118. The attenuator 118 corrects amplitude error in the linear amplifier and conveys the attenuated signal to the delay line 120. The delay line 120 generally comprises one or more delay lines which may be swapped in and/or out in order to correct the delay of the linear amplifier by a desired amount. The component delay lines, however, each have a fixed amount of delay. Therefore, only increments of delay may be realized and component delay lines must be swapped into and out of the delay line 120 for a proper configuration.

The error circuit 122 receives both the output of the linear amplifier 112 from path 1 and the output of path 2 and produces an error signal which may be used in subsequent signal processing to correct or offset error.

Figure 7:
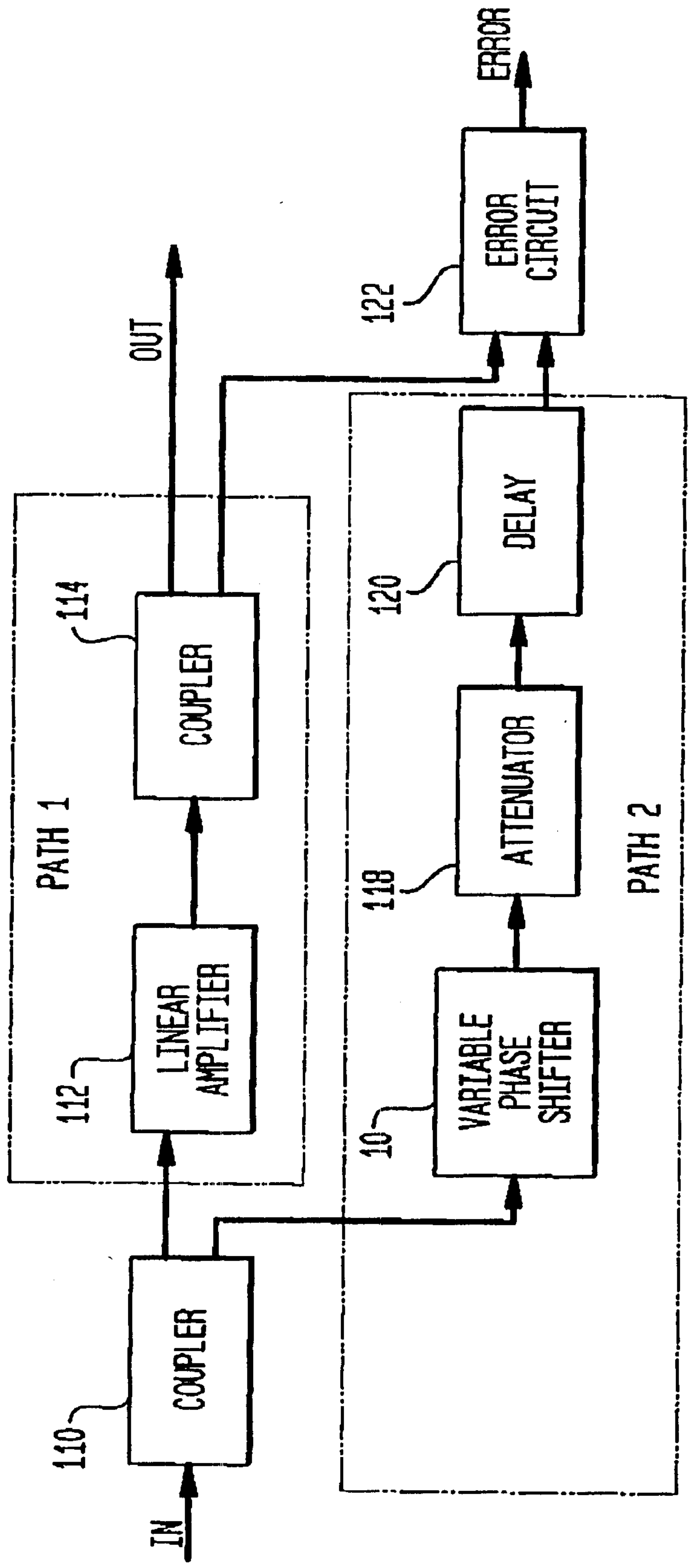
FIG. 7 depicts a system, including a linear amplifier and a phase and delay shifting element according to the present invention, for correcting errors in the linear amplifier.

FIG. 7 depicts an alternate implementation of a system, including a linear amplifier, according to the present invention. The system of FIG. 7 includes the same functional blocks as the system of FIG. 6, except that a variable phase shifter and delay block 10 is used in FIG. 7 in lieu of (or optionally in addition to) the variable phase shifter 116. The variable phase shifter and delay block 10 shifts the phase and the delay of the signal input to path 2 a desired amount as described with reference to the embodiments depicted in FIGS. 1–3. Both the phase and the delay imposed by block 10 may be adjusted mechanically or electronically according to the embodiment chosen. Moreover, because the variable phase and delay block 10 permits any delay over a continuous range of values to be used, delay lines need not be swapped into and out of the delay line block 120. Rather, either no delay line block 120 needs to be used or a delay line block 120 may be chosen to implement a rough amount of delay with the variable phase shift and delay block 10 permitting fine adjustment of the delay.

While specific embodiments of the invention have been described, it will be understood that changes may be made to these embodiments without departing from the spirit and scope of the invention.

What is claimed is:

1. An apparatus for providing an adjustable phase shift and delay to a signal, comprising:

an inverting element having first and second ends, the first end serially coupled with an input signal;

first and second variable capacitors coupled to the first end and the second end, respectively; and first and second adjustable voltage sources associated with the first and second variable capacitors, respectively, for adjusting a voltage applied across the first and second variable capacitors, wherein the first and second variable capacitors are separately adjustable to controllably vary a phase and a delay of a reflection of the input signal.

2. The apparatus according to claim 1, wherein the inverting element is a quarter wavelength transmission line.

3. The apparatus according to claim 1, wherein the inverting element includes lumped element components.

4. The apparatus according to claim 1, wherein the capacitors are mechanically adjustable capacitors and the first and second voltages are at the same potential.

5. The apparatus according to claim 1, wherein the capacitors are adjusted to different values in order to realize a desired phase shift and delay.

6. The apparatus according to claim 1, further comprising:

a directional coupler having first, second and third ports, the first port being coupled with the input signal, the second port being coupled with the first end and the third port conveying the output signal, the directional coupler conveying the input signal applied at the first port to the second port and conveying the reflection of the input signal applied at the second port to the third port.

7. The apparatus according to claim 6, further comprising:

first and second fixed capacitors, the first fixed capacitor being coupled between the second port and the first end and the second fixed capacitor being coupled between the second end and the second variable capacitor.

8. The apparatus according to claim 1, further comprising:

a second inverting element having third and fourth ends;

a directional coupler having first, second, third and fourth ports, the directional coupler conveying signals applied at the third port to the fourth port;

third and fourth variable capacitors coupled to the third and fourth ends, respectively; and third and fourth adjustable voltage sources associated with the third and fourth variable capacitors, respectively, for adjusting a voltage applied across the third and fourth variable capacitors, wherein the third and fourth variable capacitors are separately adjustable to controllably vary a phase and delay of the input signal emanating from the third port.

* * * * *